United States Patent

Hosoi et al.

Patent Number: 5,606,180
Date of Patent: Feb. 25, 1997

[54] III-V COMPOUND SEMICONDUCTOR WITH HIGH CRYSTAL QUALITY AND LUMINOUS EFFICIENCY

[75] Inventors: Nobuyuki Hosoi; Kenji Shimoyama; Hideki Goto, all of Tsuchiura, Japan

[73] Assignee: Mitsubishi Chemical Corporation, Tokyo, Japan

[21] Appl. No.: 299,994

[22] Filed: Sep. 1, 1994

[30] Foreign Application Priority Data

Sep. 3, 1993 [JP] Japan ................................. 5-220140
Sep. 3, 1993 [JP] Japan ................................. 5-220141

[51] Int. Cl.$^6$ .......................... H01L 27/15; H01L 31/12; H01L 33/00
[52] U.S. Cl. ............................... 257/86; 257/94; 257/96; 257/103; 257/190; 257/201; 257/615
[58] Field of Search ................... 257/85, 86, 94, 257/96, 97, 103, 184, 190, 201, 615, 628; 372/45, 46

[56] References Cited

U.S. PATENT DOCUMENTS

| | | | |
|---|---|---|---|
| 5,016,252 | 5/1991 | Hamada et al. | 372/45 |
| 5,103,270 | 4/1992 | Sato et al. | 257/96 |
| 5,121,183 | 6/1992 | Ogasawara et al. | 257/184 |
| 5,235,194 | 8/1993 | Izumiya et al. | 257/96 |
| 5,287,377 | 2/1994 | Fukuzawa et al. | 372/45 |
| 5,352,909 | 10/1994 | Hori | 257/201 |

FOREIGN PATENT DOCUMENTS

| | | |
|---|---|---|
| 0325275 | 7/1989 | European Pat. Off. . |
| 3527269A1 | 2/1986 | Germany . |

*Primary Examiner*—Sara W. Crane
*Attorney, Agent, or Firm*—David G. Conlin; Peter F. Corless

[57] ABSTRACT

The invention includes a Group III-V compound semiconductor that comprises (1) a thin crystal film of $A_1^{III}As_wP_{1-w}$, wherein $A_1^{III}$ represents a Group III element with Al composition of less than 0.3, $0.5 < w \leq 1$, formed on a semiconductor crystal substrate or on an epitaxial film grown on the substrate, a thin crystal film of $B^{III}As$, wherein $B^{III}$ represents a Group III element with Al composition of not less than 0.45, formed on the $A_1^{III}As_wP_{1-w}$ film, and a thin film of $C_1^{III}As_xP_{1-x}$, wherein $C_1^{III}$ represents a Group III element with Al composition of less than 0.3, $0 \leq x \leq 0.5$, formed on the $B^{III}As$ film; or (2) a thin film of $A_2^{III}As_uP_{1-u}$, wherein $A_2^{III}$ represents a Group III element with In composition of not less than 0.3, $0 \leq u \leq 1$, formed on a semiconductor crystal substrate or on an epitaxial film grown on the substrate, a thin crystal film of $B^{III}As$, wherein $B^{III}$ represents a Group III element with Al composition of not less than 0.45, formed on the $A_2^{III}As_uP_{1-u}$ film, and a thin film of $C_2^{III}As_zP_{1-z}$, wherein $C_2^{III}$ represents a Group III element, $0 \leq z \leq 1$, formed on the $B^{III}As$ film.

8 Claims, 2 Drawing Sheets

III-V COMPOUND SEMICONDUCTOR WITH HIGH CRYSTAL QUALITY AND LUMINOUS EFFICIENCY

BACKGROUND OF THE INVENTION

The present invention relates to a process for producing semiconductors composed of the Group III-V compounds and Group III-V compound semiconductors. More particularly, the present invention relates to a method for growing crystals of Group III-V compound semiconductors used for various semiconductor devices such as laser diodes, light-emitting diodes, high electron-mobility transistors, etc., and Group III-V compound semiconductors obtained by the method.

The following methods have been known for crystal growth of the elements used for the semiconductor devices:

(i) crystal of $C_1^{III}As_xP_{1-x}$ ($C_1^{III}$: Group III element, $0 \leq x < 0.5$) is directly grown on $A_1^{III}As_wP_{1-w}$ ($A_1^{III}$: Group III element with Al composition of less than 0.3, $0.5 < w \leq 1$) formed on a semiconductor crystal substrate or on an epitaxial film grown on the said substrate; and (ii) crystal of $A_2^{III}As_uP_{1-u}$ ($A_2^{III}$: Group III element with In composition of not less than 0.3, $0 \leq u \leq 1$) is grown on a semiconductor crystal substrate or on an epitaxial film grown on the said substrate, and after an interruption of crystal growth in which a heating step is required, $C_2^{III}As_zP_{1-z}$ crystal ($C_2^{III}$: Group III element, $0 \leq z \leq 1$) is grown directly on $A_2^{III}As_uP_{1-u}$.

For crystal growth of $(Al_yGa_{1-y})_{0.5}In_{0.5}P$ ($0 \leq y \leq 1$) which is a material of visible laser diodes or visible light emitting diodes, generally a GaAs buffer layer is grown on a GaAs substrate and the said crystal material is directly grown on the GaAs buffer layer by the MOVPE (metal organic vapor phase epitaxy).

However, the direct growth of $(Al_yGa_{1-y})_{0.5}In_{0.5}P$ ($0 \leq y \leq 1$) crystal on the GaAs buffer layer formed on a GaAs substrate involves problems that substitution takes place between As in the GaAs crystal and P in the vapor phase to cause interfacial defects, thereby making it unable to obtain AlGaInP crystal with good quality. Especially in growth of AlGaInP crystal with high Al composition, the crystal growth needs to be carried out at a high temperature (not less than 700° C.) for preventing contamination of the crystal with oxygen, so that the influence of the interfacial defects due to substitution between As in the GaAs crystal and P in the vapor phase was vital.

Also, growth of the GaAs buffer layer on a semiconductor substrate is preferably carried out at a low temperature of less than 700° C. for minimizing diffusion of impurities from the substrate crystal into the epitaxial crystal layer. Further, in case the buffer layer has a high In content as $A_2^{III}As_uP_{1-u}$ ($A_2^{III}$: Group III element with In composition of not less than 0.3, $0 \leq u \leq 1$), when the crystal growth is carried out at a high temperature, it is required to supply a large quantity of In since the In incorporation efficiency into the crystal is reduced. Thus, it is advantageous to carry out the crystal growth of the $A_2^{III}As_uP_{1-u}$ buffer layer ($A_2^{III}$: Group III element with In composition of not less than 0.3, $0 \leq u \leq 1$) at a low temperature (less than 700° C.).

On the other hand, the light-emitting layer of a light-emitting semiconductor device needs to have a high luminous efficiency as well as good crystal quality. Therefore, it is generally preferable that the growth of the light-emitting layer be carried out at a high temperature. Especially in the case where the light-emitting layer contains Al (for example, layer composed of AlGaInP or AlGaAs), when the crystal growth is carried out at a low temperature (less than 700° C.), Al element which is one of components of the layer is reacted with oxygen remaining in a trace amount in the growth gas to cause contamination of the crystal with the oxides or occurrence of micro-defects, so that it is impossible to obtain a crystal with high luminous efficiency and good quality. Therefore, it is preferable that the growth of AlGaInP or AlGaAs be carried out at a high temperature (not less than 700° C.) so as to prevent the grown crystal from being contaminated with the Al and oxygen reaction product.

For these reasons, in the crystal growth method in which $A_2^{III}As_uP_{1-u}$ crystal is first grown on a substrate and then AlGaInP or AlGaAs crystal is grown on the $A_2^{III}As_uP_{1-u}$ buffer layer, it is usual practice to carry out the growth of $A_2^{III}As_uP_{1-u}$ crystal ($A_2^{III}$: Group III element with In composition of not less than 0.3, $0 \leq u \leq 1$) at a low temperature (around 660° C.) and then elevate the temperature to conduct the growth of AlGaInP or AlGaAs crystal at a high temperature of not less than 700° C.

According to this method, however, a part of In in the $A_2^{III}As_uP_{1-u}$ crystal grown at a temperature is desorbed in the course of heating due to high vapor pressure, thereby causing surface defects of the grown crystal. The AlGaInP or AlGaAs crystal grown thereon inherits these defects, so that it is impossible to obtain the desired high-quality AlGaInP or AlGaAs crystal.

As a result of intensive studies for overcoming these technical problems, it has been found that by growing a thin crystal film of $B^{III}As$ ($B^{III}$ represents a Group III element with Al composition of not less than 0.3) as a protective film on a thin film of $A_1^{III}As_wP_{1-w}$ ($A_1^{III}$ represents a Group III element with Al composition of less than 0.3, $0.5 < w \leq 1$) or $A_2^{III}As_uP_{1-u}$ ($A_2^{III}$ represents a Group III element with In composition of not less than 0.3, $0 \leq u \leq 1$) formed on a semiconductor crystal substrate or on an epitaxial layer grown on the semiconductor crystal substrate, it is possible to prevent the said interfacial defects, especially the crystal defects caused in the heating step, and to obtain good the crystals lattice-matched to the underlying layer. The present invention has been attained on the basis of this finding.

SUMMARY OF THE INVENTION

An object of the present invention is to form a thin crystal film of $C_1^{III}As_xP_{1-x}$ or $C_2^{III}As_zP_{1-z}$ which is substantially free of contamination with impurities or micro-defects.

Another object of the present invention is to provide a high-reliability and high performance semiconductor device using said crystal film.

To attain the aims, in a first aspect of the present invention, there is provided a process for producing a Group III-V compound semiconductor, which comprises:

(1) forming a thin crystal film of $A_1^{III}As_wP_{1-w}$ ($A_1^{III}$ represents a Group III element with Al composition of less than 0.3, $0.5 < w \leq 1$) on a semiconductor crystal substrate or on an epitaxial film grown on the said substrate, forming thereon a thin crystal film of $B^{III}As$ ($B^{III}$ represents a Group III element containing Al in a composition of not less than 0.3), and further forming thereon a thin film of $C_1^{III}As_xP_{1-x}$ ($C_1^{III}$ represents a Group III element with Al composition of less than 0.3, $0 \leq x < 0.5$); or (2) forming a thin film of $A_2^{III}As_uP_{1-u}$ ($A_2^{III}$ represents a Group III element with In composition of not less than 0.3, $0 \leq u \leq 1$) on a semiconductor crystal substrate or on an epitaxial film grown on the said substrate, forming thereon a thin crystal film of $B^{III}As$ ($B^{III}$ represents a Group III element with Al composition of not less than 0.3), and further forming thereon a thin film of $C_2^{III}As_zP_{1-z}$ ($C_2^{III}$ represents a Group III element, $0 \leq z \leq 1$).

In a second aspect of the present invention, there is provided a Group III-V compound semiconductor, which comprises:

(1) a thin crystal film of $A_1^{III}As_wP_{1-w}$ ($A_1^{III}$ represents a Group III element with Al composition of less than 0.3, $0.5 < w \leq 1$) formed on a semiconductor crystal substrate or on an epitaxial film grown on the said substrate, a thin crystal film of $B^{III}As$ ($B^{III}$ represents a Group III element with Al composition of not less than 0.3) formed on the $A_1^{III}As_wP_{1-w}$ film, and a thin film of $C_1^{III}As_xP_{1-x}$ ($C_1^{III}$ represents a Group III element with Al composition of less than 0.3, $0 \leq x < 0.5$) formed on the $B^{III}As$ film; or (2) a thin film of $A_2^{III}As_uP_{1-u}$ ($A_2^{III}$ represents a Group III element with In composition of not less than 0.3, $0 \leq u \leq 1$) formed on a semiconductor crystal substrate or on an epitaxial film grown on the said substrate, a thin crystal film of $B^{III}As$ ($B^{III}$ represents a Group III element with Al composition of not less than 0.3) formed on the $A_2^{III}As_uP_{1-u}$ film, and a thin film of $C_2^{III}As_zP_{1-z}$ ($C_2^{III}$ represents a Group III element, $0 \leq z \leq 1$) formed on the $B^{III}As$ film.

In a third aspect of the present invention, there is provided a Group III-V compound semiconductor defined in the second aspect, which is produced by the process defined in the first aspect.

DETAILED DESCRIPTION OF THE INVENTION

Figure 1:
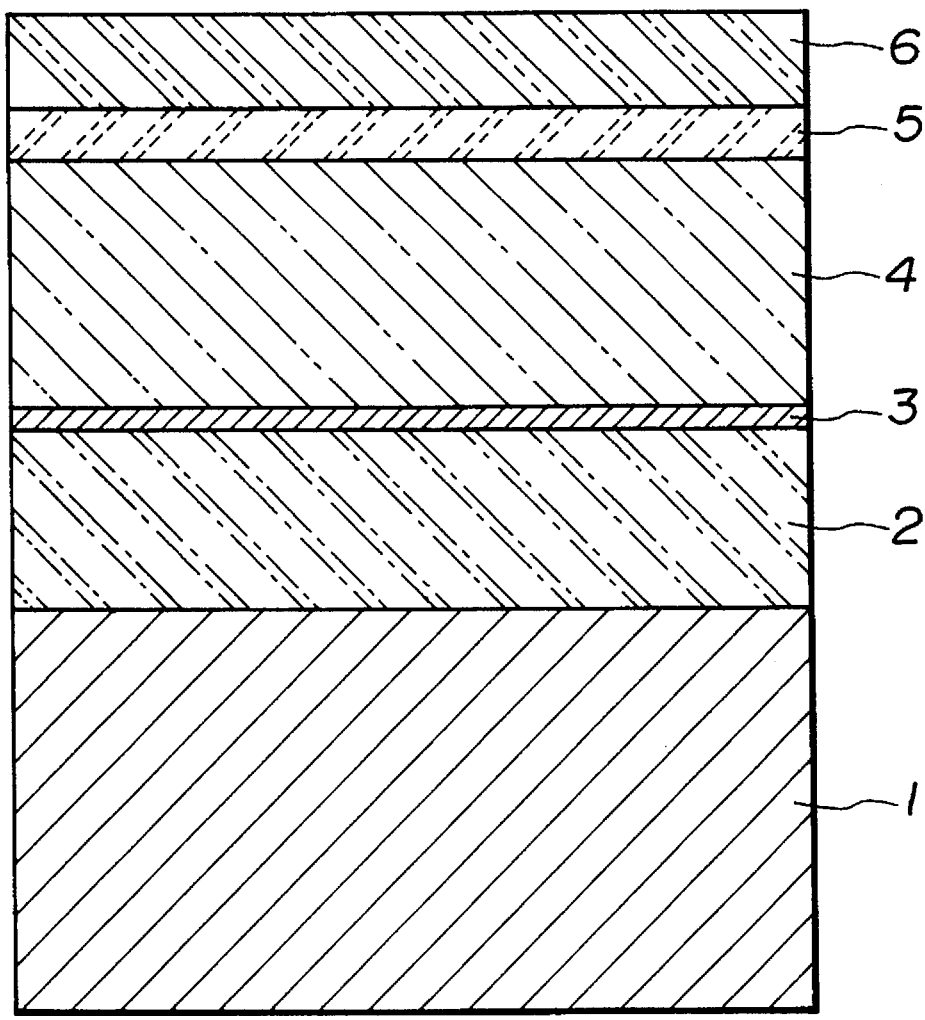
FIG. 1 is a schematic illustration of the structure of Example 1 fabricated according to the process of the present invention.

In the present invention, a thin crystal film of $A_2^{III}As_uP_{1-u}$ is formed on a semiconductor crystal substrate or on an epitaxial layer grown on the semiconductor crystal substrate, at a temperature of preferably less than 700° C., more preferably 600° to 680° C., for the reason mentioned above.

Examples of $A_1^{III}As_wP_{1-w}$ usable in present invention which contain a Group III element with Al composition of less than 0.3, include InAsP, AlInAs, AlInAs, Aeons, AlGaAs, GaAs, GaAsP, etc.

Examples of $A_2^{III}As_uP_{1-u}$ which contain a Group III element with In composition of not less than 0.3, include InAsP, AlInAsP, AlInAs, Aeons, AlInP, GaInP, AlGaInP, InGaAs, InGaAsP, etc.

The each thickness of the thin crystal film of $A_1^{III}As_wP_{1-w}$ and $A_2^{III}As_uP_{1-u}$ is variable depending on the purpose of use of this thin crystal film. In case it is used as a buffer layer, each thickness is preferably in the range from 0.1 to 2 μm.

The semiconductor crystal substrate or the epitaxial layer grown on the substrate used in the present invention is preferably one which has no possibility of causing lattice mismatch between the $A_1^{III}As_wP_{1-w}$ or $A_2^{III}As_uP_{1-u}$ layer and the semiconductor crystal substrate or the epitaxial layer grown thereon. More preferably, the substrate or the epitaxial layer grown thereon is of the same composition as the $A_1^{III}As_wP_{1-w}$ or $A_2^{III}As_uP_{1-u}$ layer.

The thickness of the semiconductor crystal substrate is variable depending on the purpose of use thereof, but it is preferably in the range from 100 to 500 μm.

The thin crystal film of $B^{III}As$ used in the present invention serves as a protective layer for inhibiting substitution between As in the underlying layer of $A_1^{III}As_wP_{1-w}$ crystal and P in the vapor phase or desorption of In in the $A_2^{III}As_uP_{1-u}$ crystal layer. The lower limit of thickness of the said $B^{III}As$ crystal film is 0.5 nm, preferably 2 nm, in the case of AlAs crystal film.

Since the $B^{III}As$ crystal film can take its effect as a protective layer in spite of its small thickness such as mentioned above, application of this $B^{III}As$ layer gives substantially no influence to the electrical and optical properties of the product. The upper limit of thickness of this $B^{III}As$ crystal film can be raised to a level close to the critical thickness which does not cause dislocation due to lattice mismatch, but for the economical reason, the upper limit of the thickness of the said $B^{III}As$ crystal film is 10 μm. Thus, the film thickness is in the range from 0.5 nm to 10 μm, preferably from 2 nm to 5 μm, more preferably 5 nm to 2 μm. The thin film of $B^{III}As$ ($B^{III}$ represents a Group III element with Al composition of not less than 0.3) is grown at the same temperature as in the case of its underlying layer so that there won't take place desorption of a part of As or In from the underlying layer of $A_1^{III}As_wP_{1-w}$ or $A_2^{III}As_uP_{1-u}$ crystal during growth to cause surface defects.

AlGaAs and AlAs can be mentioned as typical examples of $B^{III}As$. The composition of Al contained in the Group III element in $B^{III}As$ should be not less than 0.3, preferably not less than 0.45. For producing a salient effect, the Al composition is preferably not less than 0.55, and in the case where the film thickness is reduced, the said composition is preferably not less than 0.7.

In the case of growing $C_1^{III}As_xP_{1-x}$ ($C_1^{III}$: Group III element, $0 \leq x \leq 0.5$) of a desired composition on the $B^{III}As$ ($B^{III}$: Group III element with Al composition of not less than 0.3) layer, there can be obtained a $C_1^{III}As_xP_{1-x}$ layer with very good crystal quality.

Growth of $C_2^{III}As_zP_{1-z}$ ($C_2^{III}$: Group III element, $0 \leq z \leq 1$) on the $B^{III}As$ ($B^{III}$: Group III element with Al composition of not less than 0.3) layer is carried out at a higher temperature than conventionally used in the case where Al is contained, such as AlGaInP or AlGaAs crystal, for the reasons mentioned before.

Even in case the growth of $C_2^{III}As_zP_{1-z}$ is carried out at the same temperature as used for the underlying layer, when the crystal growth is interrupted for some reason or other before $C_2^{III}As_zP_{1-z}$ crystal is grown, the $B^{III}As$ protective layer proves effective for preventing desorption of In.

The crystal growth mentioned above can be accomplished according to a known MOVPE (metal organic vapor phase epitaxy) or MOMBE (metal organic molecular beam epitaxy). It is also possible to employ other known methods such as VPE (vapor phase epitaxy) or MBE (molecular beam epitaxy).

In the crystal growth method according to the present invention, it is possible to prevent desorption of In from the underlying layer even under high temperatures owing to application of a thin crystal film of $B^{III}As$ ($B^{III}$: Group III element with Al composition of not less than 0.3) which is grown as underlying layer before growth of $C_1^{III}As_xP_{1-x}$ or $C_{2III}As_zP_{1-z}$ crystal. Also, since As is scarcely desorbed because of high Al-As bond energy, the $B^{III}As$ ($B^{III}$: Group III element with Al composition of not less than 0.3) film surface remains free of defects during heating step. Therefore, even when growth of $C_1^{III}As_xP_{1-x}$ or $C_2^{III}As_zP_{1-z}$ crystal is carried out at a high temperature on $A_1^{III}As_wP_{1-w}$ or $A_2^{III}As_uP_{1-u}$ crystal of the buffer layer having its surface protected with a $B^{III}As$ film, there is induced no defect such as seen in the conventional practice and a high-quality crystal well reflecting the growth effect at a high temperature can be obtained.

Even in case growth of $C_2^{III}As_zP_{1-z}$ is performed at the same temperature as used for the growth of its underlying layer, when it is necessary to interrupt the crystal growth for some reason or other, the $B^{III}As$ layer proves to be very useful for preventing trouble in such an occasion.

The above-described crystal growth method is particularly effective when the substrate crystal is GaAs, GaP, InP or an alloy semiconductor thereof, and the equal effect can be obtained in each case.

According to the method of the present invention, substitution between As in the crystal of $A_1^{III}As_wP_{1-w}$ ($A_1^{III}$: Group III element with Al composition of less than 0.3, $0.5<w\leq1$) on a semiconductor substrate and P in the vapor phase is inhibited to prevent occurrence of interfacial defects. The thus grown $C_1^{III}As_xP_{1-x}$ ($C_1^{III}$ represents a Group III element with Al composition of less than 0.3, $0\leq x<0.5$) crystal is substantially free of impurities or microdefects and can therefore serve as a high-quality crystal with strong photoluminescence intensity.

It is also possible to grow the crystal of AlGaInP or AlGaAs at an optimal temperature higher than used for forming a buffer layer on a semiconductor substrate, and the thus grown AlGaInP or AlGaAs crystal has few impurities or micro-defects and can serve as a high-quality crystal with strong photoluminescence intensity.

EXAMPLES

The present invention is further described below with reference to the examples thereof, which examples are, however, merely intended to be illustrative and not to be construed as limiting the scope of the invention.

Example 1

An undoped double heterostructure (DH structure) was produced according to the MOCVD as shown in FIG. 1. First, GaAs crystal 2 was grown to a thickness of 0.5 μm to form a buffer layer on a GaAs (100) substrate 1. On this buffer layer was grown a 1.5 nm-thick AlAs film 3 to form a surface protective layer. Growth of these GaAs buffer layer and AlAs film was carried out under the following conditions: temperature=700° C., pressure=$10^2$ hPa, V/III molar ratio=50, growth rate=2.0 82 m/hr. On the said protective layer 3 were grown successively a 0.5 μm-thick $(Al_{0.7}Ga_{0.3})_{0.5}In_{0.5}P$ cladding 4, a 0.1 μm-thick $(Al_{0.5}Ga_{0.5})_{0.5}In_{0.5}P$ active layer 5 and a 0.2 μm-thick $(Al_{0.7}Ga_{0.3})_{0.5}In_{0.5}P$ cladding 6, under the conditions of a temperature of 700° C., a pressure of $10^2$ hPa, V/III molar ratio of 450 and growth rate of 1.0 μm/hr.

Comparative Example 1

The same procedure as Example 1 was carried out except that no AlAs film 3 was provided.

The DH structure grown according to the method of the present invention generated approximately 10 times stronger photoluminescence intensity than the DH structure formed according to the conventional crystal growth method (Comparative Example 1).

Example 2

Figure 2:
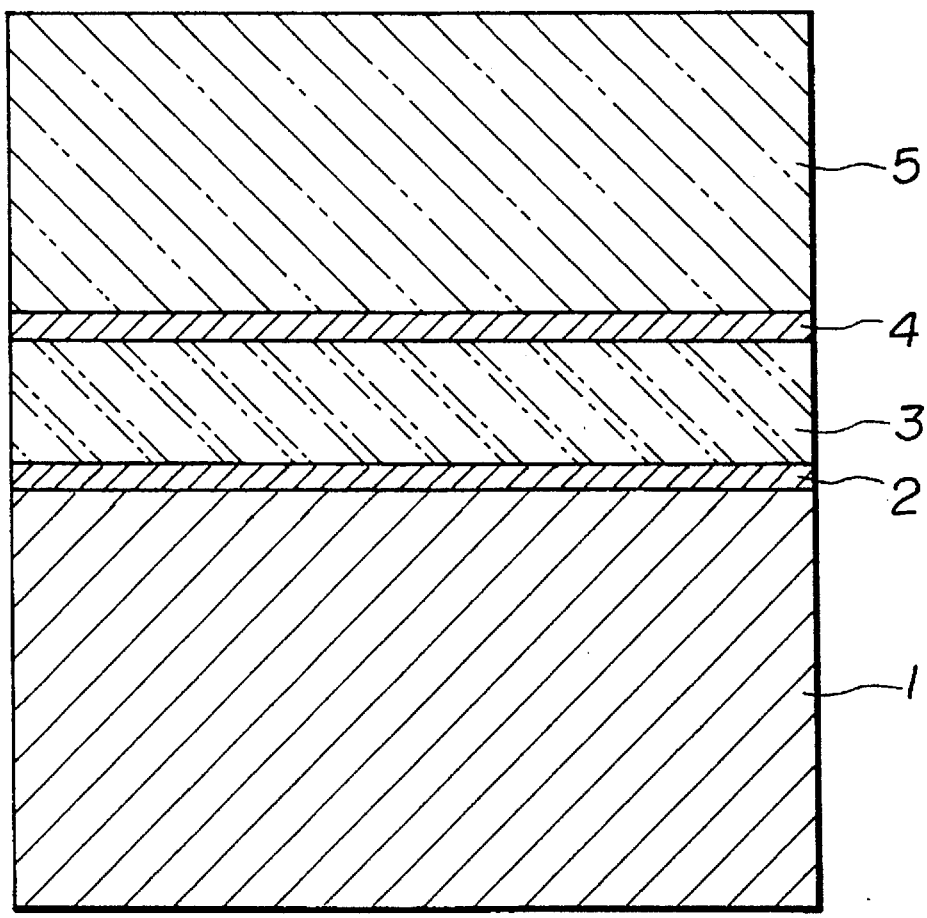
FIG. 2 is a schematic illustration of the structure of Example 2 fabricated according to the process of the present invention.

As shown in FIG. 2, a 1.5 nm-thick AlAs film 2 was grown to form a surface protective layer on a GaAs (100) substrate 1 according to the MOVPE under the conditions of a temperature of 660° C., a pressure of $10^2$ hPa, V/III molar ratio of 50 and growth time of 7 seconds. On this surface protective layer $Ga_{0.5}In_{0.5}P$ crystal 3 was grown at a temperature of 660° C. to a thickness of 0.2 μm to form as buffer layer on AlAs film 2 under the conditions of a pressure of $10^2$ hPa, V/III molar ratio of 450 and growth rate of 1.0 μm/hr. On this buffer layer 3 was grown a 1.5 nm thick AlAs film 4 at a temperature of 660° C. to form a surface protective layer under the conditions of a pressure of $10^2$ hPa, V/III molar ratio of 50 and growth time of 7 seconds. Then the temperature was raised at a rate of 5° C./min till reaching 700° C. As the gas atmosphere duri heating, hydrogen gas was flown along with $AH_3$ gas of 10 vol % based on hydrogen gas for preventing release of As from AlAs. Then $(Al_{0.5}Ga_{0.5})_{0.5}In_{0.5}P$ crystal 5 was grown to a thickness of 0.5 μm under the conditions of a temperature of 700° C., a pressure of $10^2$ hPa, V/III molar ratio of 450 and growth rate of 1.0 μm/hr.

Comparative Example 2

$(Al_{0.7}Ga_{0.5})_{0.5}In_{0.5}P$ sample structure was grown by following the procedure of Example 2 except that no AlAs film 3 was provided.

The sample structure provided with the AlAs layer generated about 10-fold stronger photoluminescence intensity than the sample structure having no AlAs layer.

What is claimed is:
1. A Group III-V compound semiconductor comprising:
(1) a thin crystal film of $A_1^{III}As_wP_{1-w}$, wherein $A_1^{III}$ represents a Group III element with Al composition of less than 0.3, $0.5<w\leq1$, formed on a semiconductor crystal substrate or on an epitaxial film grown on the said substrate,
   a thin crystal film of $B^{III}As$, wherein $B^{III}$ represents a Group III element with Al composition of not less than 0.45, formed on the $A_1^{III}As_wP_{1-w}$ film, and
   a thin film of $C_1^{III}As_xP_{1-x}$, wherein $C_1^{III}$ represents a Group III element with Al composition of less than 0.3, $0\leq x0.5$, formed on the $B^{III}As$ film; or
(2) a thin film of $A_2^{III}As_uP_{1-u}$, wherein $A_2^{III}$ represents a Group III element with In composition of not less than 0.3, $0\leq u\leq1$, formed on a semiconductor crystal substrate or on an epitaxial film grown on the said substrate,
   a thin crystal film of $B^{III}As$, wherein $B^{III}$ represents a Group III element with Al composition of not less than 0.45, formed on the $A_2^{III}As_uP_{1-u}$ film, and
   a thin film of $C_2^{III}As_zP_{1-z}$, wherein $C_2^{III}$ represents a Group III element, $0\leq z\leq1$, formed on the $B^{III}As$ film.

2. A group III-V compound semiconductor according to claim 1, wherein the thickness of the thin crystal film of $B^{III}As$ is 0.5 nm to 10 μm.

3. A group III-V compound semiconductor according to claim 1, wherein the thickness of the thin crystal film of $B^{III}As$ is 2 nm to 5 μm.

4. A group III-V compound semiconductor according to claim 1, wherein the Group III element is at least one element selected from the group consisting of Al, Ga and In.

5. A group III-V compound semiconductor according to claim 1, wherein $B^{III}As$ is selected from the group consisting of AlGaAs and AlAs.

6. A Group III-V compound semiconductor according to claim 1, produced by the process comprising (1) forming a thin crystal film of $A_1^{III}As_wP_{1-w}$, wherein $A_1^{III}$ represents a Group III element with Al composition of less than 0.3, $0.5<w\leq1$, on a semiconductor crystal substrate or on an epitaxial film grown on said substrate, forming thereon a thin crystal film of $B^{III}As$, wherein $B^{III}$ represents a Group III element with Al composition of not less than 0.45, and forming thereon a thin crystal film of $C_1^{III}As_xP_{1-x}$, wherein $C_1^{III}$ represents a Group III element with Al composition of less than 0.3, $0\leq x 0.5$; or (2) a thin film of $A_2^{III}As_uP_{1-u}$, wherein $A_2^{III}$ represents a Group III element with In composition of not less than 0.3, $0\leq u \leq 1$, on a semiconductor crystal substrate or on an epitaxial film grown on the said substrate, forming thereon a thin crystal film of $B^{III}As$, wherein $B^{III}$ represents a Group III element with Al composition of not less than 0.45, and forming thereon a thin film of $C_2^{III}As_zP_{1-z}$, wherein $C_2^{III}$ represents a Group III element, $0\leq z\leq 1$.

7. A Group III-V compound semiconductor according to claim 1, wherein $B^{III}$ represents a Group III element with Al composition of not less than 0.55.

8. A group III-V compound semiconductor according to claim 1, wherein $B^{III}$ represents a Group III element with Al composition of not less than 0.7.

* * * * *